United States Patent [15] 3,665,508

Gawler [45] May 23, 1972

[54] LINEAR DOUBLE BALANCED DIODE MIXER

[72] Inventor: Glenn B. Gawler, Liverpool, N.Y.

[73] Assignee: General Electric Company

[22] Filed: Jan. 4, 1971

[21] Appl. No.: 103,633

[52] U.S. Cl. ....................325/446, 321/60
[51] Int. Cl. ....................H04b 1/26
[58] Field of Search ....................178/5.45 D; 325/446; 329/163, 329/166

[56] References Cited

UNITED STATES PATENTS

| | | | |
|---|---|---|---|
| 2,550,524 | 4/1951 | Braden | 325/446 |
| 3,579,116 | 5/1971 | Knirsch | 325/446 |

*Primary Examiner*—Benedict V. Safourek
*Assistant Examiner*—Albert J. Mayer
*Attorney*—Richard V. Lang, Carl W. Baker, Frank L. Neuhauser, Oscar B. Waddell and Joseph B. Forman

[57] ABSTRACT

An improved double balanced diode mixer for high frequency operation is described. The mixer contains two series connected pairs of high frequency diodes operated in a modified bridge configuration. The diode series pairs are alternately switched on and off by a local source of high frequency oscillations. The high frequency signal being mixed is applied across the interconnections between the diodes in each series pair. An IF output signal resulting from the mixing process is derived at the output. Mutual isolation is provided between the diode series pairs in their coupling to the local source so that current flowing in one pair produces a minimum effect upon current flowing in the other pair. This provision generally lessens the adverse effects of the charge storage and other diode parasitics at high operating frequencies. The mixer is relatively free of spurious responses and undesired intermodulation products in the IF pass band and is suitable for use in a television receiver.

9 Claims, 8 Drawing Figures

INVENTOR:
GLENN B. GAWLER,

BY Richard V. Lang
HIS ATTORNEY.

LINEAR DOUBLE BALANCED DIODE MIXER

BACKGROUND OF THE INVENTION

1. Field of the Invention

The present invention relates to mixer circuits for general high frequency use including television reception, communications and telemetry applications. The primary function of the mixer herein described is to convert signals lying in a band of high frequencies to a single intermediate frequency at which the signals in the band may be individually separated and amplified by a fixed frequency amplifier.

2. Description of the Prior Art

The present invention is an improvement over the conventional double balanced mixer wherein four diodes are operated in a standard closed bridge. The standard bridge configuration, even when high frequency diodes are employed, suffers from limitations in the diodes, and in the circuits which couple the signal and the local oscillator to the diode bridge. These limitations usually lower the conversion efficiency of the mixer and cause nonlinearity in the mixing function. Nonlinearity in the mixing function causes spurious responses and undesired intermodulation products in the pass band of the IF amplifiers. Thus, when plural strong signals are present in the input of the mixer, they may adversely interfere with the desired signal.

SUMMARY OF THE INVENTION

Accordingly, it is an object of the present invention to provide an improved linear mixer for high frequency operation.

It is a further object of the present invention to provide an improved linear mixer for use in a television receiver.

It is an additional object of the present invention to provide an improved double balanced mixer for use in a television receiver wherein spurious responses and intermodulation effects are minimized.

It is yet another object of the present invention to provide an improved double balanced diode mixer having enhanced high frequency performance minimizing high frequency limitations arising in the diodes.

It is still another object of the present invention to provide an improved double balanced mixer wherein improved high frequency coupling means are provided for coupling to the diodes.

These and other objects of the invention are achieved in a novel diode mixer comprising: a first series pair of high frequency diodes and a second series pair of high frequency diodes; a local source of high frequency oscillations; means balanced to ground for coupling the local source to the first diode pair to achieve forward conduction during positive half cycles of the source and to said second diode pair to achieve forward conduction during negative half cycles of said source, the coupling means coupling said diode pairs in mutual isolation so that current flowing from said local source through one diode pair has a minimum effect upon current flowing from said source through the other diode pair; a second source of high frequency signals to be mixed with said local source; an RF transformer for applying signals from said second source to the two diode pairs, the transformer having a secondary connected between the interconnection between diodes of the first pair and the interconnection between diodes of the second pair; and means for deriving an intermediate frequency output signal connected between a center tap on said secondary and ground.

In accordance with another aspect of the invention, the local source provides oscillations of large amplitude relative to those provided by the second or signal source so that the diodes are driven well past the knee of their conduction characteristics by the local source and exhibit an essentially linear characteristic to the signal.

In accordance with further aspects of the invention an improved mode of isolative coupling from the local source to the diode pairs is provided in the form of individual trifilarly wound radio frequency transformers associated with each diode pair, and each employing a toroidal core which is primarily resistive at the intended frequency of operation so as to reduce leakage inductance and make the magnetization impedance of the transformer primarily resistive.

BRIEF DESCRIPTION OF THE DRAWINGS

The novel and distinctive features of the invention are set forth in the claims appended to the present application. The invention itself, however, together with the objects and further advantages thereof may best be understood by reference to the following description and accompanying drawings in which:

DESCRIPTION OF PREFERRED EMBODIMENTS

Figure 1:
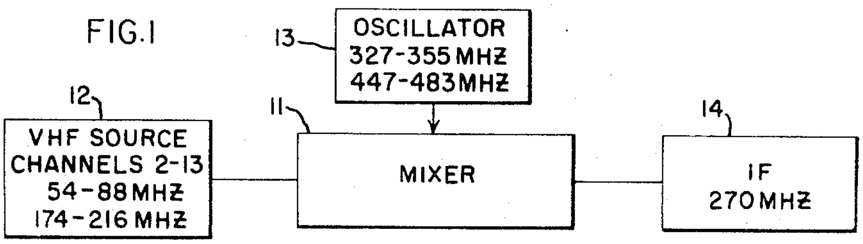
FIG. 1 is a block diagram of a portion of a television receiver comprising a linear double balanced mixer incorporating the invention.

Referring now to FIG. 1, the signal conversion portions of a television receiver for VHF signals incorporating the novel mixer are illustrated in block diagram form. The linear double balanced mixer of the invention is illustrated at block 11. A source 12 of very high (VHF) televisions signals, and in particular channels 2–13, is coupled to a first input of the mixer 11 and local oscillator 13 is coupled to a second input of the mixer. By mixing the two inputs, the mixer 11 converts the VHF signals from source 12 to a fixed intermediate frequency of 270 MHz and applies the converted signal to the IF amplifier 14 for further amplification and adjacent channel separation.

As illustrated in FIG. 1, the operating frequencies of the VHF spectrum lie between 54 and 216 MHz. The oscillator 13 is arranged to be tuned to a frequency above that of the mixer by a quantity equal to the intermediate frequency of 270 MHz. Thus, the oscillator operates within the frequency spectrum of 327–355 MHz for the low channels and 447–483 MHz for the upper channels in the VHF television band. The source 12 of VHF signals may comprise a conventional antenna and tuned amplifier designed to select individual channels from those locally available. In a preferred form, however, the source 12 may contain a wideband filter designed to accept all upper and lower channel VHF signals simultaneously. It is desirable in either case that the mixer operate with maximum linearity and provide an output which is free from spurious responses and undesired inter-modulation products within the subsequent IF pass band.

Figures 2, 3, 6:
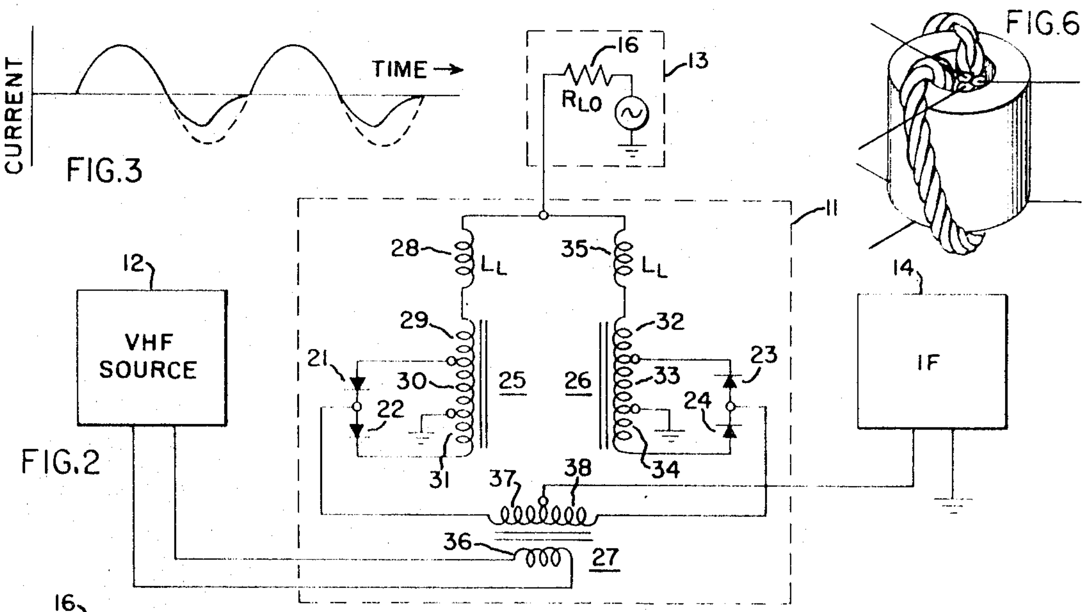
FIG. 2 is an electrical circuit representation of the linear mixer.
FIG. 3 is a graph of a current waveform of a serially connected diode pair.
FIG. 6 is an illustration of the mechanical construction of a ferrite core transformer component employed in the double balanced diode mixer.

The linear double balanced mixer of the invention is illustrated in circuit diagram form in FIG. 2. FIG. 2 again illustrates the basic components of the signal conversion portions of a television receiver; the source of VHF signals 12, the IF amplifier 14 being illustrated in block form as before, while the mixer 11 is shown in an electrical circuit form and the oscillator 13 is illustrated in an equivalent circuit representation, comprising an equivalent generator 15 having an internal resistance 16.

The mixer 11 comprises four semiconductor diodes 21, 22, 23 and 24 in a modified bridge configuration and three ferrite core transformer components 25, 26 and 27, associated with the foregoing diodes. The first transformer component 25 is an autotransformer containing three windings, with an equivalent inductance shown at 28 symbolic of the leakage inductance of the device 25. The ferrite core of the device is symbolized by the parallel lines drawn in proximity to the three serially mounted windings 29, 30 and 31. The external terminal of the first winding 29 is shown connected (through the leakage inductance 28) to the oscillator 13.

The autotransformer 25 is associated with the diode pair 21, 22. The autotransformer tap between the windings 29 and 30 is connected to the anode of the rectifier 21; the tap between the windings 30 and 31 is grounded; while the remote end of the winding 31 is connected to the cathode of the diode 22. The cathode of the diode 21 is connected to the anode of the diode 22 and both electrodes are connected to the third transformer device 27.

The transformer 26 is similar to transformer 25 and, except for an inversion of diode polarities, is similarly connected to the diode pair 23, 24. It contains three serially connected windings 32, 33 and 34. The external terminal of the winding 32 is connected (through an equivalent inductance 35 corresponding to the leakage inductance) to the oscillator 13. The tap between the windings 32 and 33 is connected to the cathode of the diode 23; the tap between the windings 33 and 34 is grounded; while the remote end of the winding 34 is connected to the anode of the diode 24. The anode of diode 23 is connected to the cathode of the diode 24 and both electrodes are connected to the transformer device 27.

The autotransformers 25 and 26 apply high frequency oscillations from the oscillator 16 to the two diode pairs. The primaries of the autotransformers 25 and 26 consist of windings 29, 30 and 32, 33, respectively. Oscillations from the local oscillator 13 are applied to these "primary" windings. The secondary windings 30, 31 are mutually balanced with respect to ground and coupled to the diode pair 21, 22. The windings 33, 34 are mutually balanced with respect to ground and coupled to the diode pair 23, 24. Likewise, the windings between the two transformers are made equal. Thus, the secondary windings supply equal valued local oscillations to both diode pairs, and these voltages are balanced with respect to ground.

The diodes of pair 21, 22 are connected in series and poled to become simultaneously conductive during positive half cycles of the oscillator output voltage. Conversely, the diodes of pair 23, 24 are connected in series and poled to become simultaneously conductive during negative half cycles of the oscillator output voltage.

The third transformer 27 completes the mixer. It has a ferrite core and has a separate primary winding 36 and a center tapped secondary consisting of series connected windings 37 and 38. The primary winding 36 is connected to the VHF source 12. The previously mentioned connection between the diode pair 21 and 22 is made to the external terminal of the winding 37 while the connection between the diode pair 23 and 24 is made to the external terminal of the winding 38. The center tap of the secondary of transformer 27 is then coupled to the IF amplifier 14.

In operation, the mixer 11 may be regarded as a "chopper" in which the VHF television signal is chopped at the local oscillator frequency. The voltage available from the oscillator 13 is made considerably larger than the signal voltage. Thus, since the oscillator voltage does determine the state of conductivity of the diodes, the oscillator may be regarded as making the diode pair 21 and 22 conductive during positive half cycles of the oscillator waveforms and as making the diode pair 23 and 24 conductive during negative half cycles of the oscillator waveform. The IF load presented to the mixer 11 is taken between the center tap of the secondary winding of transformer 27 and ground. When the diode pair 21, 22 becomes conductive during positive half cycles of oscillator voltage, the IF load circuit through the winding 37 is completed and the signal bearing current flows to the IF load. (With respect to the RF signal, the diode pair 21, 22 may be regarded as being parallel connected.) A moment later, when the diode pair 23, 24 is made conductive during the negative half cycle of oscillator voltage, the IF load circuit is completed through the secondary winding 38. (With respect to the RF signal, the diode pair 23, 24 may be regarded as being parallel connected.) Since the polarity of the RF voltage is inverted as between the two winding halves 37, 38, the effect of the foregoing diode switching is to switch the RF secondary voltage from one polarity to an opposite polarity at the local oscillator frequency. This switching produces sum and difference terms at odd multiples of the oscillator frequency. Filtering at the IF input then selects the desired difference component containing the signal.

In the foregoing discussion, the diodes are assumed to operate without charge storage or other parasitics. In particular, there has been the implicit assumption that the forward conduction follows the conventional diode reproduction of an applied sine wave.

This implies an initial diode drop as the current crosses the knee of the forward conduction characteristic, and a slightly curved dynamic characteristic. The magnitude of the oscillator voltage is made sufficiently high, so that during most of the conduction cycle, the series diode pairs are driven into relatively high levels of conduction (2 or 3 volts). Since the "knee" of the forward conduction characteristics of the individual diodes occurs at about 0.4 volts, this places the operating point at a relatively linear portion of the characteristic. The RF signal is relatively small. By remaining within close proximity to the operating point set by the oscillator, the RF signal experiences a uniform and relatively linear conduction characteristic.

At the high frequencies at which the present invention is intended to have application, however, high frequency diodes operating at conventional levels depart appreciably from the conventional performance just outlined. The actual conduction characteristics of a diode at high frequencies is illustrated in FIG. 3. At the commencement of the reverse half cycles of the oscillator voltage, the diode may continue to conduct for a substantial portion of the cycle as stored charges are swept out of the junction region. The current waveform during this reverse half cycle starts out sinusoidally. As charges are released, however, the current decays nonlinearly to a near zero value some time in advance of the start of forward conduction cycle.

Figure 4A:
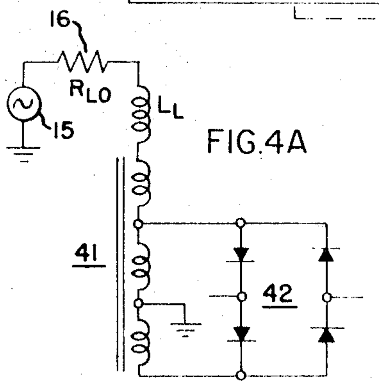
FIG. 4A is a circuit diagram of a diode bridge.
Figure 4B:
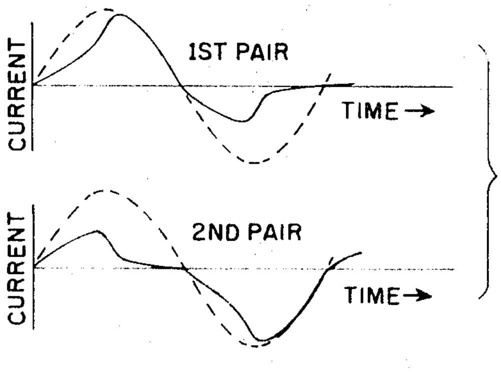
FIG. 4B is a graph of the current waveforms illustrating its performance.

When both forwardly and reversely connected diode pairs operate in a conventional four diode bridge, as shown in FIG. 4A, continuing conduction in the reversely biased diode pair has a deteriorative effect upon the overall mixing process, as seen in FIG. 4B, reducing both the conversion gain and linearity. FIG. 4A illustrates an oscillator having an equivalent generator 15 and an internal resistance 16 ($R_{LO}$) driving an autotransformer 41. For purposes of comparison, the autotransformer 41 is of the same kind as is used in the embodiment shown in FIG. 2, the symbolic leakage inductance ($L_L$) also being separately illustrated. The diode bridge 42 is a conventional bridge with all four diodes connected in the customary closed diamond.

If the current waveforms in either diode pair is examined when the diode bridge is operated at high frequency, undesired conduction in the nominally quiescent diode pair is found to reduce the current in the active diode pair during the initial part of the forward conduction period. This arises in part from internal resistance in the oscillator and in part from the leakage inductance $L_L$. Both impedances are connected in series between the oscillator and diode load where they tend to stabilize the output current derived from the generator 15 against changes in conductivity of the diodes. The effect is to make the oscillator an unavoidable virtual constant current source. Thus, any reverse conduction by one diode pair reduces the current available for forward conduction in the other diode pair. Waveforms from the two diode pairs are illustrated in FIG. 4B. The forward conduction characteristic thus has a somewhat more concave initial portion than ideal, caused by the subtractive effect of the flow of stored charge in the nominally quiescent diode pair.

Figure 5A:
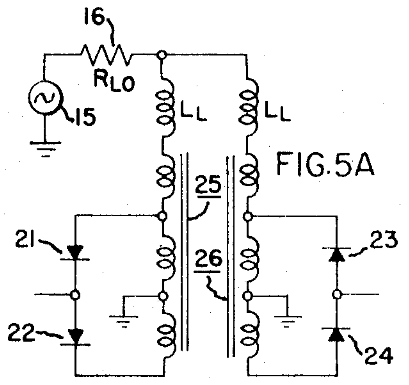
FIG. 5A is a circuit diagram of a diode bridge modified in accordance with the present invention.
Figure 5B:
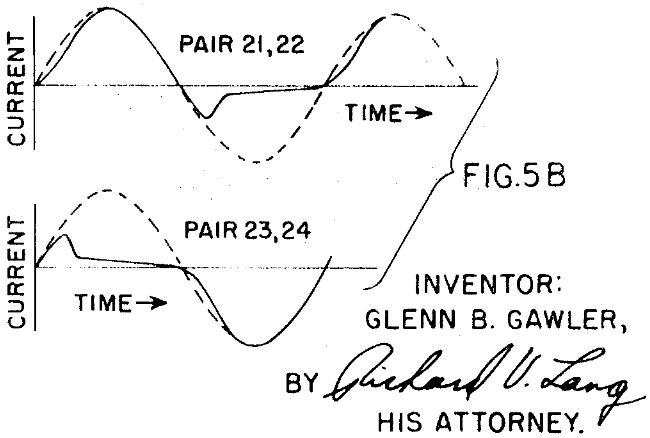
FIG. 5B is a graph of the current waveforms illustrating its performance.

In FIG. 5B corresponding current waveforms are reproduced for a diode bridge similar to that illustrated in FIG. 2 operating at high frequency. A simplified circuit diagram of the bridge is shown in FIG. 5A. For purposes of comparison, also, similar components to those illustrated in FIG. 4A are employed. Experience has shown that with the circuit of FIG. 5A, the initial conduction period of each conductive half cycle more closely approximates the ideal, and the result is an improvement in conversion efficiency and linearity.

The problems associated with high frequency operation of the mixer are partly attributable to undesired series impedance in coupling the oscillator to the diodes which cause turn-off transients in one diode pair to be reflected into the other diode pair as it is being turned on. The problems are also partly attributable to parasitics in the diodes per se. Since neither diode pair can be fully isolated, even by the circuit provisions herein proposed, both the selection of the diodes and optimization of the other components in the mixer circuit, are necessary to achieve optimum performance.

Accordingly, the diodes should be selected for high frequency operation. Hot carrier diodes are a relatively new high frequency semiconductor device designed for use at microwave frequencies and are generally suitable for the present application. The hot carrier diode is a rectifying metal-semiconductor junction device, with the metal-semiconductor interface consisting of a variety of metals usually in conjunction with n-type silicon. The hot carrier diode is based on majority carrier conduction and a Shottky barrier.

Hot carrier or Shottky diodes such as the IN5390 are suitable for VHF television operation. In general, the diodes should have small reverse bias junction capacitances, should exhibit minimum transition times between off and on states (a low voltage drop preferably near 0.3 volts), minimum storage charge in the diode junction and maximum linearity in series resistance. In general, this last factor dictates that the diodes tolerate relatively large voltage swings without saturating.

In operation of the diodes, higher oscillator levels give substantially better spur and intermodulation performance and slightly better conversion efficiency. However, excessive oscillator levels drive the diodes into saturation and this, along with increased stored charges accompanying higher current, results in increased spurs and intermodulation. There is usually a minimum distortion level of oscillator pumping where total distortion due to an inefficient crossover plus that due to diode saturation is a minimum. (Distortion here refers to the combination of spurious responses and intermodulation products.) If the transitions from conduction of one diode pair to conduction of the other diode pair is slow (usually due to stored charges), then experience shows that intermodulation and spurious responses tend to increase. Generally speaking, these effects can be minimized by suitable choice of an intermediate oscillator pumping level. The oscillator levels are, however, quite large in comparison to other modes of diode operation.

The transformers 25, 26, 27 should be optimized for the high frequency operation contemplated. To achieve this end, the following practical measures are used. Each of the transformers may be trifilarly wound upon a ferrite bead as illustrated in FIG. 6. At the television frequencies contemplated, a "Ferroxcube" shielding bead about one-eighth inch in diameter with a 1/16 inch hole, and one-eighth inch in length (K5-001-00/3B) is suitable. The trifilar windings each consist of 2½ turns of No. 30 wire, transformer 27 optionally having more turns and the windings fill the opening in the core. As a result of trifilar winding, the transformers exhibit minimum leakage inductances. The magnetic core is operated in its lossy region, the real and imaginary part of the permeability falling rapidly at frequencies above 1 megacycle. In the 50 megacycle and higher region, the reactive effect of the core is negligible and the resistive effect predominant.

Optimization achieved by these practical measures is in coupling the oscillator to the diode. As seen from the oscillator, each of the winding sections of the transformers 25 and 26 are series aiding and thus their impedance is cumulative. The effect of the lossy core is to raise the magnetizing impedance (or electrically lengthen the winding). Raising the magnetizing impedance (which appears in shunt with the diode load) minimizes loading of the oscillator by the transformers, and facilitates application of maximum oscillator power to the diodes. Magnetizing impedance here refers to the open-circuit impedance of the transformer, which appears in parallel with the load impedance of the diodes. When the magnetizing impedance is made resistive by the use of a lossy core, the leakage flux from the windings will couple into the core, but produce no leakage inductance. This is in contrast to leakage inductance produced by leakage flux coupling to a core used in its inductive mode. For these reasons, transformers using these lossy cores have minumum leakage inductances, and the low leakage inductance results in more efficient coupling of the oscillator to the diodes.

Leakage inductance of the lossy transformers is about 25 nanohenries (47 ohms reactance at 300 MHz). This reactance is appreciable compared to the 8 to 20 ohm diode resistance. In addition, the magnetizing impedance, which is a function of the permeability and the standard toroidal coil constants, becomes constant with frequency because of the behavior of permeability with frequency.

Secondly, optimization is achieved in coupling the mixer output signal to the IF load. The transformer 27 couples the VHF signal into the mixer. The primary objective of its design is to couple the RF signal into the mixer with efficiency in a balanced fashion. The VHF signal couples the IF load in a circuit including windings 36 and 37; diodes 21, 22; and windings 30, 31 when diodes 21, 22 are conducting. The VHF signal is coupled to the IF load in a circuit including windings 36 and 38; diodes 23, 24 and windings 33, 34 when diodes 23, 24 are conducting. When diodes 21, 22 conduct, windings 30 and 31 buck providing a minimum series impedance between winding 37 and IF load 14. When diodes 23, 24 conduct, windings 33 and 34 buck to provide minimum series impedance between winding 38 and IF load 14. The suggested design keeps leakage inductance of windings 30, 31 and 33, 34, which appear as series impedance, small for optimum conversion efficiency.

While the transformer 27 may conveniently be built similarly to the transformers 25 and 26, there are some differences in the underlying design considerations. The resistive magnetizing impedance may now appreciably and undesirably shunt the signal, because the signal is at a higher impedance level and the magnetizing impedance proportionately lower. Here, it is advantageous to increase the number of turns in the transformer. The increased leakage inductance that results is not objectionable because of the higher load impedance levels, while the accompanying higher resistive magnetizing impedance has a decreased shunting effect on the VHF signal flow. This constitutes an optimum way to use lossey-core transformers for the VHF signal. An inductive core would give a very large resistive magnetizing impedance and a slightly higher leakage inductance, resulting in some slight improvement in efficiency. However, at these frequencies inductive cores are expensive, and the improvement in performance from an inductance core is marginal, tending to make an inexpensive lossy core a more practical solution.

Experience shows that transit time limitations are not appreciable in these transformers up to about 1 gigahertz. This is due to their small physical size and the short winding lengths used.

The practical embodiment of the invention herein disclosed is designed for operation in the VHF television region (50–500 MHz). In its practical form a conversion loss of approximately 4 db was experienced and with a signal input level of "9" dbm the spurious signal corresponding to the third harmonic of an interfering signal mixed with the local oscillator is at −78 db. This represents the worst spur experienced throughout the band.

The current industry standard requires that the spurious responses of all interfering signals not exceed a limit set 60 db below the desired signal. When employing a conventional closed double balanced bridge, the spurious response corresponding to the third harmonic of an RF input signal was down only 45 db below the desired signal. An example of this type of interference is interference from channel 3 in the reception of channel 9. Using the same diodes in the bridge arrangement herein disclosed approximately 30 db of improvement resulted, thus making the spurious response approximately 15 db better than the industry requirement.

The invention may be applied both at lower and at higher operating frequencies (e.g., VHF and UHF) and with different intermediate frequency selections than those herein disclosed. Available diodes permit operation at frequencies of a gigahertz and higher. (Lower limits are not dependent on the diodes, but depend upon the RF coupling.) Ordinarily, the invention has particular advantage as a mixer in a receiver with a minimum of individual signal preselection. It is thus suited to television receivers wherein only the oscillator is tuned and the prior signal processing incorporates only broad band gain and filter elements.

What is claimed as new and desired to be secured by Letters Patent of the United States is:

1. A linear double balanced diode mixer for high frequency operation comprising:
   a. a first pair of high frequency diodes connected in the same polarity in a series circuit,
   b. a second pair of high frequency diodes connected in the same polarity in a series circuit,
   c. a local source of high frequency oscillations of suitable amplitude for switching said diode pairs between nonconduction and forward conduction,
   d. means balanced to ground for coupling said local source to said first diode pair to achieve forward conduction during positive half cycles of said source and to said second diode pair to achieve forward conduction during negative half cycles of said source, said coupling means coupling said diode pairs in mutual isolation so that current flowing from said local source through one diode pair has a minimum effect upon current flowing from said source through the other diode pair,
   e. a second source of high frequency signals to be mixed with said local source,
   f. an RF transformer for applying signals from said second source to said two diode pairs, said transformer having a center tapped secondary, one end terminal being connected to the interconnection between diodes of said first pair and the other end terminal being connected to the interconnection between diodes of said second pair, and
   g. means connected between said center tap and ground for deriving an intermediate frequency output signal from said mixer.

2. A linear double balanced diode mixer as set forth in claim 1 wherein said local source provides oscillations of large amplitude relative to those provided by said second source to said diode pairs so that said diodes are driven well past the "knee" of their conduction characteristics by said local source and exhibit an essentially linear characteristic to said second source.

3. A linear double balanced diode mixer as in claim 2 wherein said diodes are hot carrier diodes.

4. A linear double balanced mixer as set forth in claim 2 wherein said isolative coupling means comprise a first RF transformer of low leakage inductance for coupling said local source to said first diode pair and a second RF transformer of low leakage inductance for coupling said local source to said second diode pair, electrical isolation being provided in part by said leakage inductances.

5. A linear double balanced mixer as set forth in claim 2 wherein said first RF transformer of said coupling means has a pair of series aiding windings connected in series across said first series diode circuit and said second RF transformer of said coupling means has a pair of series aiding windings connected in series across said second series diode circuit.

6. A linear double balanced mixer as set forth in claim 5 wherein said RF transformer for said second source is of low leakage inductance design.

7. A linear double balanced mixer as set forth in claim 5 wherein said first and second RF transformers of said coupling means are trifilarly wound to achieve minimum leakage inductance.

8. A linear double balanced mixer as set forth in claim 5 wherein said three RF transformers are each trifilarly wound upon a toroidal core to achieve minimum leakage inductance, said core providing a primarily resistive component at the intended frequency of operation so that the magnetization impedances thereof are primarily resistive.

9. A linear double balanced mixer as set forth in claim 5 wherein said first and second RF transformers are autotransformers, each trifilarly wound upon a toroidal core to achieve minimum leakage inductance, said core providing a primarily resistive component at the intended frequency of operation so that the magnetization impedances thereof are primarily resistive.

* * * * *